US010234497B2

(12) United States Patent
Chang et al.

(10) Patent No.: US 10,234,497 B2
(45) Date of Patent: Mar. 19, 2019

(54) ELECTRONIC COMPONENT STATE DETERMINATION

(71) Applicant: Google LLC, Mountain View, CA (US)

(72) Inventors: Chiu-Mao Chang, New Taipei (TW); Chih-Chung Chang, Taipei (TW)

(73) Assignee: Google LLC, Mountain View, CA (US)

( * ) Notice: Subject to any disclaimer, the term of this patent is extended or adjusted under 35 U.S.C. 154(b) by 37 days.

(21) Appl. No.: 15/670,855

(22) Filed: Aug. 7, 2017

(65) Prior Publication Data

US 2019/0041452 A1   Feb. 7, 2019

(51) Int. Cl.
| | | |
|---|---|---|
| G01R 31/02 | (2006.01) | |
| H02M 3/06 | (2006.01) | |
| H03K 17/10 | (2006.01) | |
| G01R 31/28 | (2006.01) | |
| H03K 19/017 | (2006.01) | |

(52) U.S. Cl.
CPC ... *G01R 31/2812* (2013.01); *H03K 19/01721* (2013.01); *G01R 31/025* (2013.01)

(58) Field of Classification Search
CPC .............. G01R 31/2812; G01R 31/025; H03K 19/01721
USPC ................................. 327/108; 324/252, 686
See application file for complete search history.

(56) References Cited

U.S. PATENT DOCUMENTS

| | | |
|---|---|---|
| 5,600,271 A | 2/1997 | Erickson et al. |
| 2005/0073198 A1* | 4/2005 | Sakai ................. H03K 19/0016 307/18 |

FOREIGN PATENT DOCUMENTS

WO    2015054224    4/2015

OTHER PUBLICATIONS

"International Search Report and Written Opinion", PCT Application No. PCT/US2018/028032, dated Jul. 10, 2018, 9 pages.

\* cited by examiner

*Primary Examiner* — Farhana A Hoque
(74) *Attorney, Agent, or Firm* — Colby Nipper

(57) ABSTRACT

Techniques are disclosed for increasing a quantity of candidate electronic-component states determinable from one or more input pins. The techniques may use an internal pull resistor to test a strength of an external resistor to gain two extra candidate pin states. Additional candidate electronic-component states are then gained based on the extra candidate pin states, combinations of pin states of two or more input pins, and/or detecting a short between two or more input pins.

20 Claims, 11 Drawing Sheets

Electronic Component States
Based on Two
Three-State Inputs 1002

| Pin 1 | Pin 2 |
|---|---|
| 0 | 0 |
| 0 | 1 |
| 0 | 2 |
| 1 | 0 |
| 1 | 1 |
| 1 | 2 |
| 2 | 0 |
| 2 | 1 |
| 2 | 2 |
| 0 | S1 |
| 1 | S1 |
| 2 | S1 |

Electronic Component States
Based on Two
Four-State pins 1004

| Pin 1 | Pin 2 |
|---|---|
| 0 | 0 |
| 0 | 1 |
| 0 | 2 |
| 0 | 3 |
| 1 | 0 |
| 1 | 1 |
| 1 | 2 |
| 1 | 3 |
| 2 | 0 |
| 2 | 1 |
| 2 | 2 |
| 2 | 3 |
| 3 | 0 |
| 3 | 1 |
| 3 | 2 |
| 3 | 3 |
| 0 | S1 |
| 1 | S1 |
| 2 | S1 |
| 3 | S1 |

Key 1006

0 = State 0
1 = State 1
2 = State 2
3 = State 3
Sn = Short with pin n

FIG. 10

ELECTRONIC COMPONENT STATE DETERMINATION

BACKGROUND

An electronic component, such as a graphics processing unit or a memory device, may be used in variety of electronic systems, such as various models of a cell phone or a tablet computing device. For the electronic component to be used in a particular electronic system, the electronic component detects that it is in an environment of the particular electronic system and is configured for use with the particular electronic system. For example, if a graphics processing unit is to be used in a large-screen model of a cell phone, is must be configured for use in the large-screen model environment, rather than a small-screen model environment.

Conventional techniques use two-state input pins for detecting that an electronic component is in an environment (also called an "electronic-component state"), such as general purpose input/output ("GPIO") pins. The electronic-component state is used to determine a corresponding configuration of the electronic component for use with the electronic system. The state of the electronic component may be determined based at least in part on states of one or more GPIO pins. To determine a state of a GPIO pin, the electronic component detects whether the GPIO pin is coupled to a high voltage (e.g., a voltage that would be read by a logic gate as a 1) or a low voltage (e.g., a voltage that would be read by a logic gate as a 0). In this way, the GPIO pin is a two-state input, having one state as a high voltage state and another state as a low voltage state.

The electronic system may provide the high voltage or the low voltage using an external pull resistor coupled to the GPIO pin. A pull resistor is used to pull a voltage of a signal toward a reference voltage to which it is coupled, thereby improving accuracy in determining the state of the GPIO pin. A pull resistor that is coupled to a low voltage is called a pull-down resistor. A pull resistor that is coupled to a high voltage is called a pull-up resistor.

If the electronic component includes more than two candidate configurations, multiple GPIO pins must be used to detect a combined pin state. For example, two conventional two-state GPIO pins may be used to provide four candidate electronic-component states based on combined pin states (0,0), (0,1), (1,1), and (1,0). Thus, an electronic component configurable with more than two electronic component configurations must reserve at least two GPIO pins for determining an electronic-component state. An electronic component configurable with more than four electronic component configurations must reserve at least three GPIO pins for determining an electronic-component state. As electronic components are designed for increased versatility, the electronic components will require more and more GPIO pins for configuration information. However, as more GPIO pins are used for configuration, the chip must be large to accommodate the GPIO pins.

This background provides context for the disclosure. Unless otherwise indicated, material described in this section is not prior art to the claims in this disclosure and is not admitted to be prior art by inclusion in this section.

SUMMARY

Techniques are disclosed for increasing a quantity of candidate electronic-component states determinable from one or more input pins. The described techniques include determining a pin state from four candidate pin states. The techniques may further include determining an electronic-component state from candidate electronic-component states based on states of one or more input pins (also referred to as "inputs" or "pins"). The electronic-component state is usable to determine a configuration for the electronic component for use in an electronic system. The electronic component is then configured for use in a particular environment or with a particular electronic system.

To determine a pin state, the techniques utilize an internal pull resistor to test a strength of an external pull resistor. The external pull resistor is configured as either a pull-up resistor or pull-down resistor, and is thus determinable as a strong pull-down resistor, a weak pull-down resistor, a weak pull-up resistor, or a strong pull-up resistor. Therefore, a single input pin may be used to determine a pin state from four candidate pin states.

The described techniques can also be used to determine a pin state for another input pin of the electronic component. Thus, based on each of the input pins having four candidate pin states, sixteen candidate electronic-component states exist for an electronic component with two input pins. In contrast, four input pins would be needed to provide sixteen candidate electronic-component states using conventional techniques.

Further techniques are described for detecting a short between two or more input pins, thus further increasing a quantity of candidate electronic-component states. For example, in addition to the sixteen candidate electronic-component states for a two four-state pin configuration discussed above, four additional candidate electronic-component states are determinable. The additional four states include, for example, a short at a first pin state, a short at a second pin state, a short at a third pin state, and a short at a fourth pin state.

By utilizing the techniques described herein, many candidate electronic-component states are determinable from relatively few input pins. This allows for a smaller design of the electronic component and/or allowance for additional configurations available for the electronic component.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

FIG. 10 shows candidate electronic-component states based on combinations of pin states according to one or more implementations.

DETAILED DESCRIPTION

Overview

Figure 1:
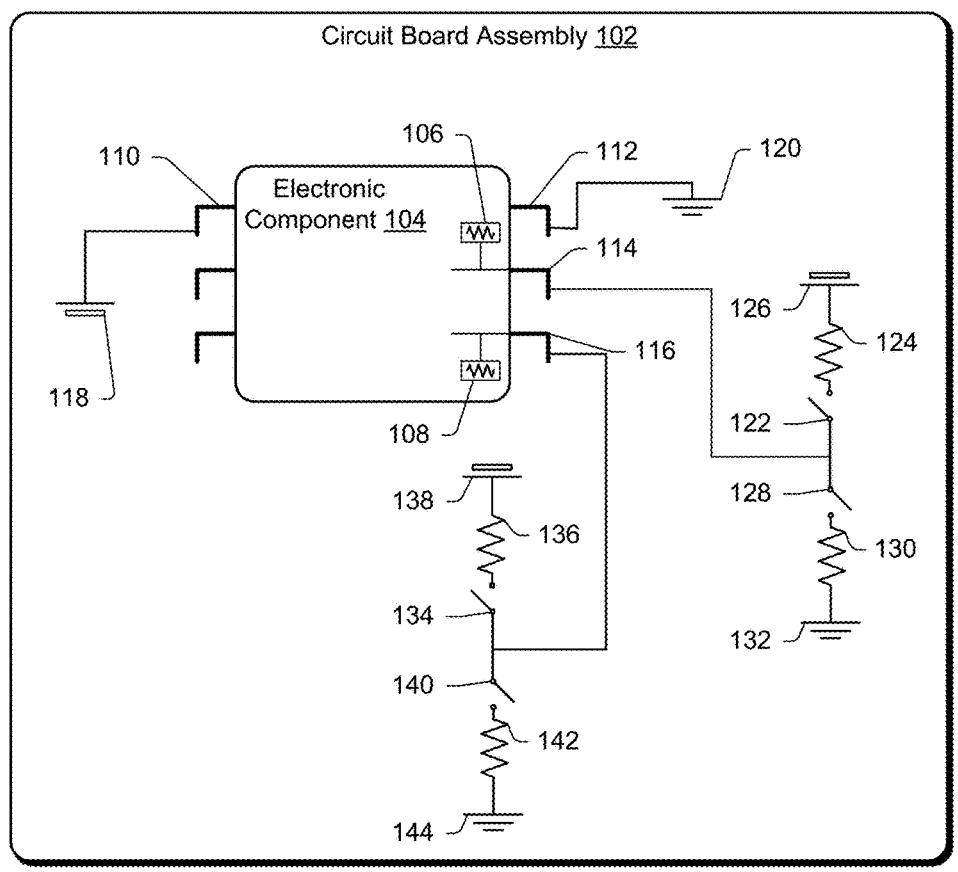
FIG. 1 is an illustration of an example environment according to one or more implementations.

Conventional techniques for providing configuration information to an electronic component inefficiently use input pins to receive the configuration information. For example, an electronic component having more than two candidate configurations requires at least two input pins for receiving the configuration information. An electronic component having more than four candidate configurations requires at least three input pins, more than eight configurations requires at least four input pins, etc.

This document describes techniques and apparatuses to increase a quantity of candidate electronic-component states detectable by one or more input pins. This may be accomplished using an internal pull resistor to test a strength of an external pull resistor to gain two extra candidate pin states. Additional candidate electronic-component states are then gained based on the extra candidate pin states, combinations of pin states of two or more input pins, and/or detecting a short between two or more input pins. An electronic-component state can be used to configure the electronic component for a particular electronic system or environment.

In an example implementation, an input pin is used to detect an external pull-up or pull-down resistor. This can be performed using a system within the electronic component including one or more logic components, such as transistors, for measuring a high voltage (at or above a pull-up threshold) or a low voltage (at or below a pull-down threshold). If an external pull-up resistor is detected, for example, an internal pull resistor coupled (electrically) to the input pin is configured as a pull-down resistor to oppose the external pull-up resistor. A voltage is then measured at the input pin to determine if a net effect of the external pull-up resistor and the internal pull-down resistor results in a pull-down resistor or a pull-up resistor. This can be determined using the system within the electronic component to measure a high voltage or a low voltage. If the system measures a high voltage, the external pull-up resistor is determined to be a strong pull-up resistor because it is able to overcome the internal pull-down resistor. Alternatively, if the system measures a low voltage, the external pull-up resistor is determined to be a weak pull-up resistor because it is unable to overcome the internal pull-down resistor. Similar analysis can be performed to determine if a detected external pull-down resistor is a strong pull-down resistor or a weak pull-down resistor.

Additionally or alternatively, a short may be detected between a first input pin and a second input pin. This may be performed by a system within the electronic component measuring a voltage at the first input pin and a voltage at the second input pin under various configurations of one or more internal pull resistors. If, during one or more configurations, the voltages measured at the first input pin and the voltages measured at the second input pin match, the system determines that the first input pin and the second input pin are shorted. The system within the electronic component may apply a voltage to one of the first input pin or the second input pin and measure a voltage at the other input pin to detect a short. A shorted configuration provides additional candidate electronic-component states.

Thus, the techniques described herein provide an improved efficiency in providing configuration information by increasing a quantity of candidate pin states and candidate electronic-component states.

In the following discussion, an example environment is first described that may employ the techniques described herein. Example procedures are then described, which may be performed in the example environment as well as other environments. Consequently, performance of the example procedures is not limited to the example environment and the example environment is not limited to performance of the example procedures. Finally, an example system and device are described that may be employed to perform the techniques.

Example Environment

FIG. 1 illustrates an environment 100 in an example implementation to determine a state for an electronic component. The illustrated environment 100 includes a circuit board assembly 102 for providing circuitry between an electronic component 104 and other electronic components. The circuit board assembly 102 may be a circuit board assembly for an electronic component such as a component device, peripheral device, display device, or motherboard. The electronic component 104 includes internal pull resistors 106 and 108 and pins 110, 112, 114, and 116. Placement of the pins 110, 112, 114, and 116 are for illustrative purposes only. The pin 110 is a voltage input pin for coupling the electronic component 104 to an input voltage from a reference voltage 118. The pin 112 is a grounding pin for coupling the electronic component 104 to a reference voltage 120. As illustrated, the reference voltage 118 is higher than the reference voltage 120.

The input pin 114 is coupled to a switch 122. The switch 122 is coupled at a terminal, through a resistor 124, to a reference voltage 126. The resistor 124 is positioned between the switch 122 and the reference voltage 126, however, the switch 122 may be positioned between the resistor 124 and the reference voltage 126. The input pin 114 is also coupled to a switch 128. The switch 128 is coupled at a terminal, through a resistor 130, to a reference voltage 132. The resistor 130 is positioned between the switch 128 and the reference voltage 132, however, the switch 128 may be positioned between the resistor 130 and the reference voltage 132. The reference voltage 126 is illustrated as being higher than the reference voltage 132. Thus, when the switch 122 is closed and the switch 128 is open, the resistor 124 is configured as a pull-up resistor. If the resistor 124 has a high resistance (or impedance), such as 100 k ohms, the resistor 124 is configured as a weak pull-up resistor. Alternatively, if the resistor has low resistance, such as 1 k ohms, the resistor 124 is configured as a strong pull-up resistor. Alternatively, when the switch 122 is open and the switch 128 is closed, the resistor 130 is configured as a pull-down resistor. If the resistor 130 has high resistance (or impedance), the resistor 130 is configured as a weak pull-down resistor. If the resistor has low resistance, the resistor 130 is configured as a strong pull-down resistor.

The input pin 116 is coupled to a switch 134. The switch 134 is coupled at a terminal, through a resistor 136, to a reference voltage 138. The resistor 136 is coupled to the switch 134 at a terminal and the reference voltage 138 at another terminal, however, the switch 134 may be alternatively positioned between the resistor 136 and the reference voltage 138. The input pin 116 is also coupled to a switch 140. The switch 140 is coupled, through a resistor 142, to a reference voltage 144. The resistor 142 is positioned between the switch 140 and the reference voltage 144, however, the switch 142 may be alternatively positioned between the resistor 142 and the reference voltage 144. The reference voltage 138 is illustrated as being higher than the reference voltage 144. Thus, when the switch 134 is closed and the switch 140 is open, the resistor 136 is configured as a pull-up resistor. If the resistor 136 has a high resistance, the resistor 136 is configured as a weak pull-up resistor. Alternatively, if the resistor 136 has a low resistance, the resistor 136 is configured as a strong pull-up resistor. When the switch 134 is open and the switch 140 is closed, the resistor 142 is configured as a pull-down resistor. If the resistor 142 has a high resistance, the resistor 142 is configured as a weak pull-down resistor. Alternatively, if the resistor 142 has a low resistance, the resistor 142 is configured as a strong pull-down resistor.

The switches 122, 128, 134, and 142 may be controlled via the circuit board assembly 102 to provide permanent pull-down resistors, permanent pull-up resistors, or a switchable configuration. Thus, the circuit board assembly 102 may be configured to provide one or more pull-up resistors 124 and 136 or pull-down resistors 130 and 142 to one or more input pins 114 and 116 of the electronic component 104.

One or more of the pull-up resistors 124 and 136 or the pull-down resistors 130 and 142 may be selected to facilitate a determination of four candidate pin states. The selected resistors 124, 130, 136, and/or 142 are selected based on strengths of the internal pull resistors 106 and 108. For example, the resistors 124, 130, 136, and/or 142 are chosen as one of a weak pull-down resistor, a weak pull-up resistor, a strong pull-down resistor, or a weak pull-up resistor based on:

$$Rwpd > Ripu(\max) \Big/ \left(1 - \left(\frac{Vih(\min)}{Vsup}\right)\right) \times \left(\frac{Vih(\min)}{Vsup}\right); \quad \text{Equation 1}$$

$$Rwpu > Ripd(\max) \Big/ \left(\frac{Vil(\max)}{Vsup}\right) \times \left(1 - \left(\frac{Vil(\max)}{Vsup}\right)\right); \quad \text{Equation 2}$$

$$Rspd < Ripu(\min) \Big/ \left(1 - \left(\frac{Vil(\max)}{Vsup}\right)\right) \times \left(\frac{Vil(\max)}{Vsup}\right); \text{ and} \quad \text{Equation 3}$$

$$Rspu > Ripd(\min) \Big/ \left(\frac{Vih(\min)}{Vsup}\right) \times \left(1 - \left(\frac{Vih(\min)}{Vsup}\right)\right); \quad \text{Equation 4}$$

where Rwpd is resistance of a weak pull-down resistor; Ripu(max) a maximum resistance of an internal pull-down resistor; Vih(min) is a minimum input high voltage, e.g., a pull-up threshold; Vsup is a supply voltage, such as one or more of the reference voltages 118, 126, or 138; Rwpu is resistance of a weak pull-up resistor; Ripd(max) a maximum resistance of an internal pull-down resistor; Vil(max) is a maximum input low voltage, e.g., a pull-down threshold; Rspd is resistance of a strong pull down resistor; Ripu(min) is a minimum resistance of an internal pull-up resistor; Rspu is resistance of a strong pull-down resistor; and Ripd(min) is a minimum resistance of an internal pull-down resistor. The minimum resistance and maximum resistance of internal pull-down resistors and internal pull-up resistors may be determined from a data sheet for the electronic component 104, or may be determined through testing.

Figure 2:
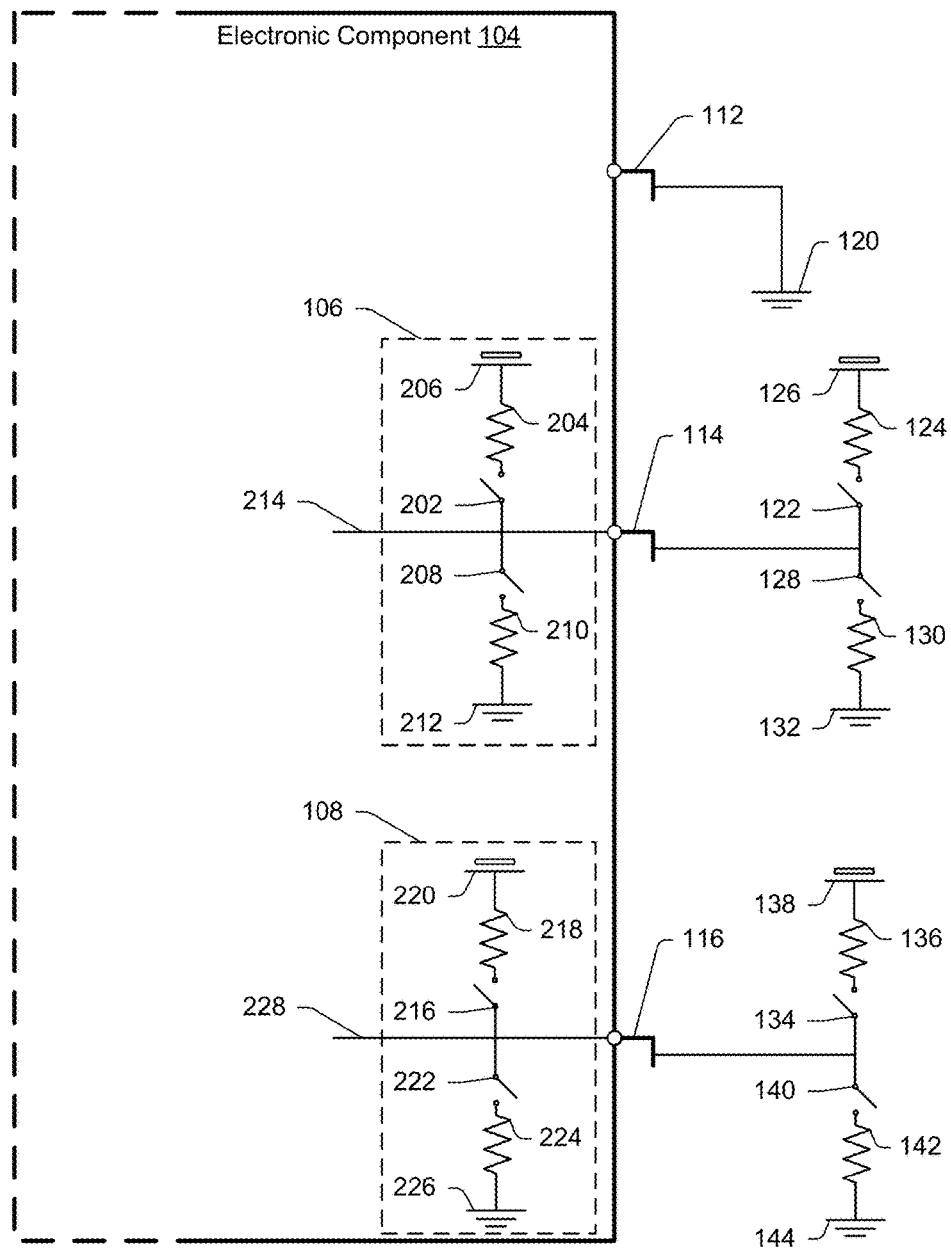
FIG. 2 is an illustration of an example configuration of an electronic component and external pull resistors according to one or more implementations.

FIG. 2 illustrates a system 200 including an example configuration of the electronic component 104 and external pull resistors 124, 130, 136, and 142. As illustrated, the input pins 114 and 116 may be general purpose input/output ("GPIO") pins, which may be used to detect and receive information from the circuit board assembly 102 to which it is coupled. The information may include a board revision, memory/storage configuration, or battery topology. The electronic component 104 may use the information to configure itself for use in the environment 100.

The electronic component 104 is enlarged to show the internal pull resistors 106 and 108 in greater detail, according to one or more implementations. The internal pull resistor 106 of FIG. 1 is illustrated having a switch 202 coupled, through a resistor 204, to a reference voltage 206. The resistor 204 is positioned between the switch 202 and the reference voltage 206, however, the switch 202 may be positioned between the resistor 204 and the reference voltage 206. The internal pull resistor is also illustrated having a switch 208 coupled, through a resistor 210, to a reference voltage 212. The resistor 210 is positioned between the switch 208 and the reference voltage 212, however, the switch 208 may be positioned between the resistor 210 and the reference voltage 212. The reference voltage 206 is illustrated as being higher than the reference voltage 212. Thus, when the switch 202 is closed and the switch 208 is open, the internal pull resistor 106 is configured as a pull-up resistor. Alternatively, when the switch 202 is open and the switch 208 is closed, the internal pull resistor 106 is configured as a pull-down resistor. The internal pull resistor 106 is also coupled to a circuitry 214 for measuring a voltage at the input pin 114 when the internal pull resistor 106 is configured as a pull-up resistor, a pull-down resistor, or an open drain (e.g., disconnected and not affecting the voltage at the input pin 114).

Similarly, the internal pull resistor 108 of FIG. 1, coupled to the input pin 116, is illustrated having a switch 216 coupled, through a resistor 218, to a reference voltage 220. The resistor 218 is positioned between the switch 216 and the reference voltage 220, however, the switch 216 may be positioned between the resistor 218 and the reference voltage 220. The internal pull resistor is also illustrated having a switch 222 coupled, through a resistor 224, to a reference voltage 226. The resistor 224 is positioned between the switch 222 and the reference voltage 226, however, the switch 222 may be positioned between the resistor 224 and the reference voltage 226. The reference voltage 220 is illustrated as being higher than the reference voltage 226. Thus, when the switch 216 is closed and the switch 222 is open, the internal pull resistor 108 is configured as a pull-up resistor. Alternatively, when the switch 216 is open and the switch 222 is closed, the internal pull resistor 108 is configured as a pull-down resistor. The internal pull resistor 108 is also coupled to a circuitry 228 for measuring a voltage at the input pin 116 when the internal pull resistor 108 is configured as a pull-up resistor, a pull-down resistor, or an open drain (e.g., disconnected and not pulling up or pulling down the voltage at the input pin 116).

In some implementations, the reference voltages 118, 126, 138, 206, and 220 are coupled together to have a same high voltage, such as supply voltage (e.g., 3.3V). Additionally or alternatively, the reference voltages 120, 132, 144, 212, and 226 are coupled together to have a same low voltage (e.g., grounded) that is has an electric potential that is lower than one or more of the reference voltages 118, 126, 138, 206, and 220.

Figure 3:
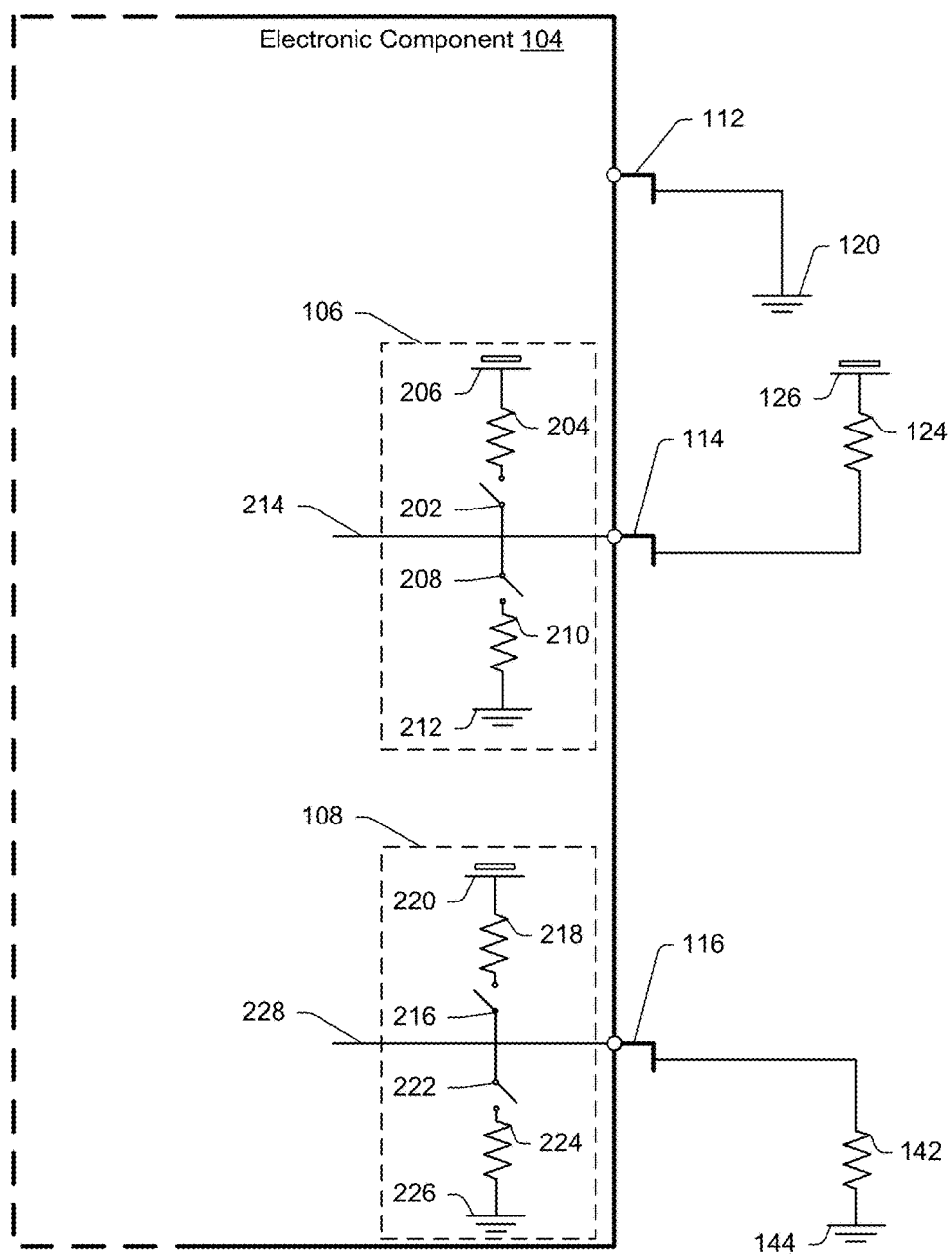
FIG. 3 is an illustration of another example configuration of an electronic component and external pull resistors according to one or more implementations.

FIG. 3 illustrates a system 300 including another example configuration of the electronic component 104 coupled to the external pull resistors 124 and 142 according to one or more implementations. As illustrated, the internal pull resistor 106 is coupled, through the input pin 114, to the resistor 124. The resistor 124 is coupled to the reference voltage 126, thus the resistor 124 is configured as a pull-up resistor. A state of the input pin 114 is based on determining that the resistor 124 is a pull-up resistor and whether the resistor 124 is a strong pull-up resistor or a weak pull-up resistor. This may be determined by uncoupling the internal pull resistor 106 from the input pin 114, by opening the switches 202 and 208, and measuring a first voltage via the circuitry 214. The first voltage is used to determine that the resistor 124 as a pull-up resistor. For example, the circuitry 214 may determine that the first voltage is above a pull-up resistor threshold. In response to determining that the resistor 124 is a pull-up resistor, the internal pull resistor is configured as a pull-down resistor and a second voltage is measured. The second voltage is used to determine whether the resistor 124 is a strong pull-up resistor, or a weak pull-up resistor. For example, the second voltage may be compared with the pull-up resistor threshold or a pull-down resistor threshold. If the second voltage is at or above a pull-up resistor threshold, the resistor 124 is determined to be a strong pull-up resistor because its upward pull is stronger than the internal pull resistor's 106 downward pull. If the second voltage is at or below a pull-down resistor threshold, the resistor 124 is determined to be a weak pull-up resistor because its upward pull is weaker than the internal pull resistor's 106 downward pull.

The internal pull resistor 108 is coupled, through the input pin 116, to the resistor 142. The resistor 142 is coupled to the reference voltage 144, thus the resistor 142 is configured as a pull-down resistor. A state of the input pin 116 is based on determining that the resistor 142 is a pull-down resistor and determining whether the resistor 142 is a strong pull-down resistor or a weak pull-down resistor. Using a similar process as described above, the circuitry 228 determines that the resistor 142 is a pull-down resistor based on measuring a third voltage when the internal pull resistor 108 is uncoupled from the input pin 116. The internal pull resistor 108 is then configured as a pull-up resistor and a fourth voltage is measured by the circuitry 228. The fourth voltage is used to determine whether the resistor 142 is a strong pull-down resistor or a weak pull-down resistor. This determination is based on comparing the fourth voltage with a pull-up resistor threshold or a pull-down resistor threshold, as described above.

Figure 4:
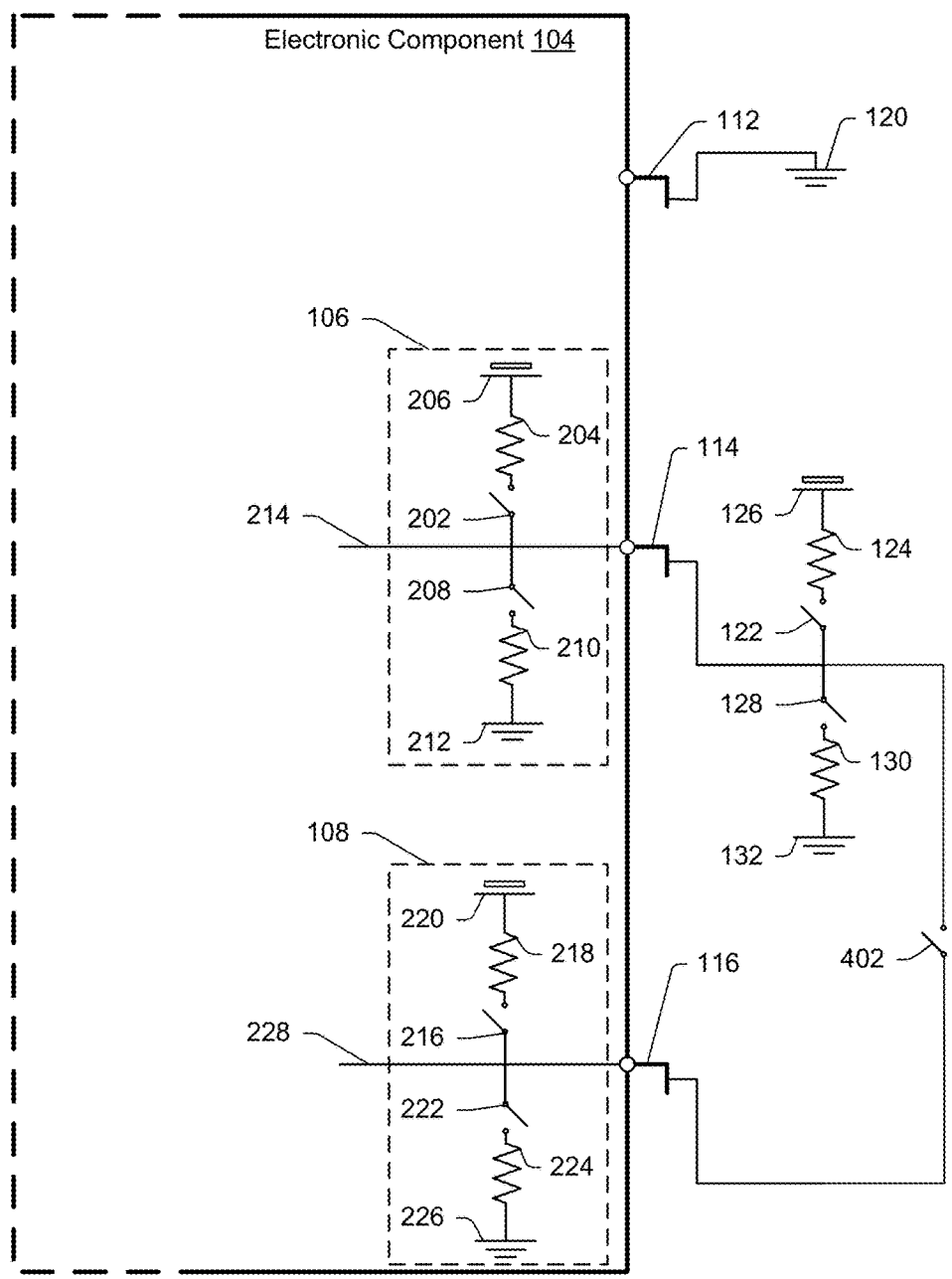
FIG. 4 is an illustration of another example configuration of an electronic component and external pull resistors according to one or more implementations.

FIG. 4 illustrates a system 400 including an example configuration of the electronic component 104 and the external pull resistors 124 and 130 according to one or more implementations. As illustrated, the input pin 114 is shortable with the input pin 116 via a switch 402. In some implementations, the switch 402 is permanently closed as a trace coupling the input pin 114 to the input pin 116. Alternatively, the switch 402 is configurable via the circuit board assembly 102 to provide information to the electronic component 104.

A short between the input pin 114 and the input pin 116 may be determined by the circuitry 214 and/or the circuitry 228. For example, the circuitry 214 may apply a high reference voltage to the input pin 114 and the circuitry 228 measures a first voltage at the input pin 116. Then, the circuitry 214 may apply a low reference voltage to the input pin 114 and the circuitry 228 measures a second voltage at the input pin 116 with the voltage at the input pin 114. If the circuitry 228 detects a difference between the first voltage measured at the input pin 116 and the second voltage measured at the input pin 116, then the input pin 116 is determined to be shorted with the input pin 114. In some implementations, the electronic component only tests for a short between the input pin 114 and the input pin 116 after determining that a state of the input pin 114 matches a state of the input pin 116. For example, if the input pin 114 is determined to be coupled to weak pull-up resistor and the input pin 116 is determined to also be coupled to a weak pull-up resistor, the electronic component 104 may use the circuitry 214 and the circuitry 228 to test for a short.

Figure 5:
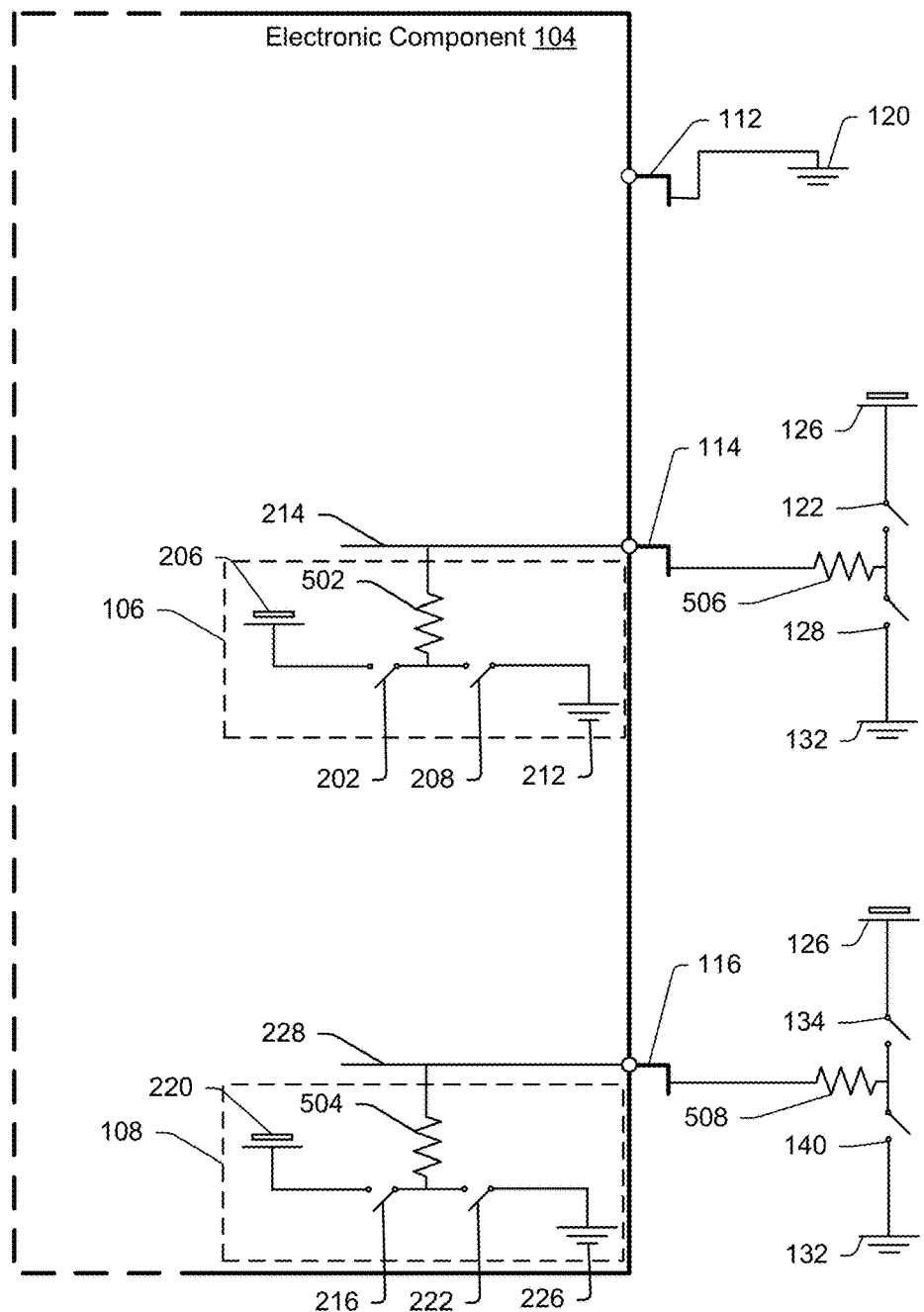
FIG. 5 is an illustration of another example configuration of an electronic component and external pull resistors according to one or more implementations.

FIG. 5 illustrates a system 500 including an example configuration of the electronic component 104 having the internal pull resistors 106 and 108 and the external pull resistors 506 and 508 according to one or more implementations. The internal pull resistor 106 includes a single resistor 502 coupleable to the reference voltage 206, via the switch 202, to form a pull-up resistor. Alternatively, the internal pull resistor 502 is coupleable to the reference voltage 212, via the switch 208, to form a pull-down resistor. Similarly, the resistor 504 is coupleable to the reference voltage 220, via the switch 216, to form a pull-up resistor. Alternatively, the internal pull resistor 504 is coupleable to the reference voltage 226, via the switch 222, to form a pull-down resistor. Each of the illustrated configurations of the internal pull resistors 106 and 108 can be configured as a pull-up resistor and a pull-down resistor using only one resistor, resistors 502 and 504, respectively. However, using multiple resistors, as in FIGS. 2-4, permits the internal pull resistors 106 and 108 to have different strengths of pull-up and pull-down configurations.

Similar to the configurations of the internal pull resistors 106 and 108, each of the resistors 506 and 508 are able to be configured as a pull-up resistor or a pull-down resistor using one resistor 506 or 508. The resistor 506 is coupleable to the reference voltage 126, via the switch 122, to form a pull-up resistor. Alternatively, the resistor 506 is coupleable to the reference voltage 132, via the switch 128, to form a pull-down resistor. Similarly, the resistor 508 is coupleable to the reference voltage 126, via the switch 134, to form a pull-up resistor. Alternatively, the resistor 508 is coupleable to the reference voltage 132, via the switch 140, to form a pull-down resistor. One or more of the switches 122, 128, 134, and 140 may be controllable via the circuit board assembly 102 or via the electronic component 104. In some implementations, one or more of the switches 122, 128, 134, and 140 can be permanently closed or permanently open. For example, the switch 122 may be shorted to permanently couple the resistor 506 to the reference voltage 126. Additionally or alternatively, the switch 128 may be permanently open, to prohibit the resistor 506 from coupling to the reference voltage 132. In this example, the resistor 506 is permanently configured as a pull-up resistor.

Figure 6:
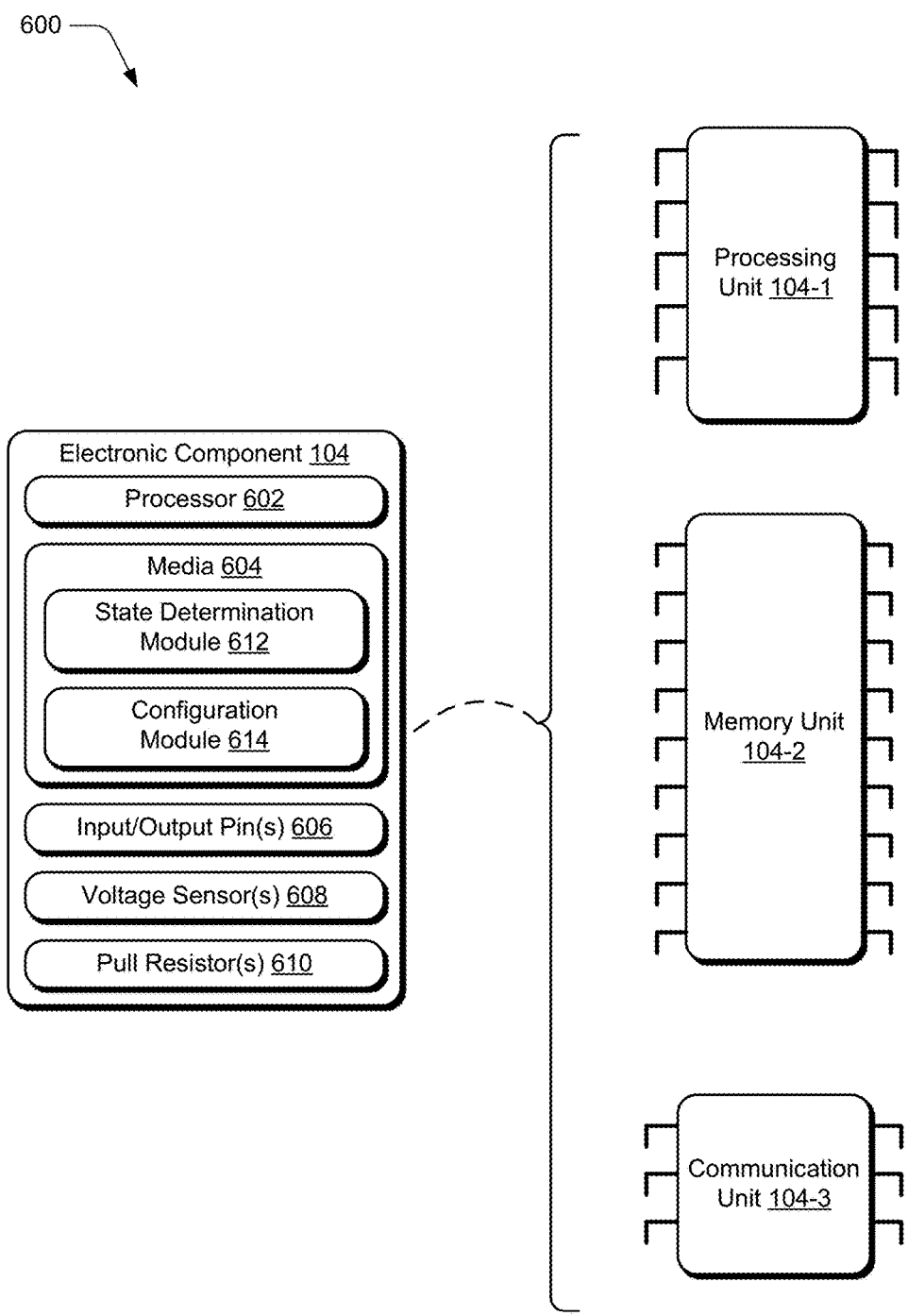
FIG. 6 is an illustration of another example configuration of an electronic component according to one or more implementations.

FIG. 6 is an illustration of system 600 including an example configuration of the electronic component 104. The electronic component 104 is illustrated, for example only, as being any of a processing unit 104-1, a memory unit 104-2, or a communication unit 104-3, however, the electronic component 104 may be any type of electronic component 104 having inputs for configuration. The electronic component 104 is configured having a processor 602 for executing media 604 to perform operations, input/output pin(s) 606, voltage sensor(s) 608, and pull resistor(s) 610. The media 604 includes a state determination module 612 for determining a state of one or more input pins 112 or 114 and identifying a candidate configuration of the electronic component 104.

The media 604 also includes a configuration module 614 for configuring the electronic component 104 based on the identified candidate configuration of the electronic component 104. The identified candidate configuration indicates the environment 100 in which the electronic component 104 is implemented. For example, the environment may include one or more of a test fixture, a programming fixture, or a printed circuit board revision.

A voltage sensor of the voltage sensor(s) 608 may compare a measured voltage with a threshold to determine if the voltage is high (at or above a pull-up threshold) or low (at or below a pull-down threshold or below a pull-up threshold). The voltage sensor may, for example, determine that a voltage is above a pull-up threshold using one or more transistors.

Example Methods

Figure 7:
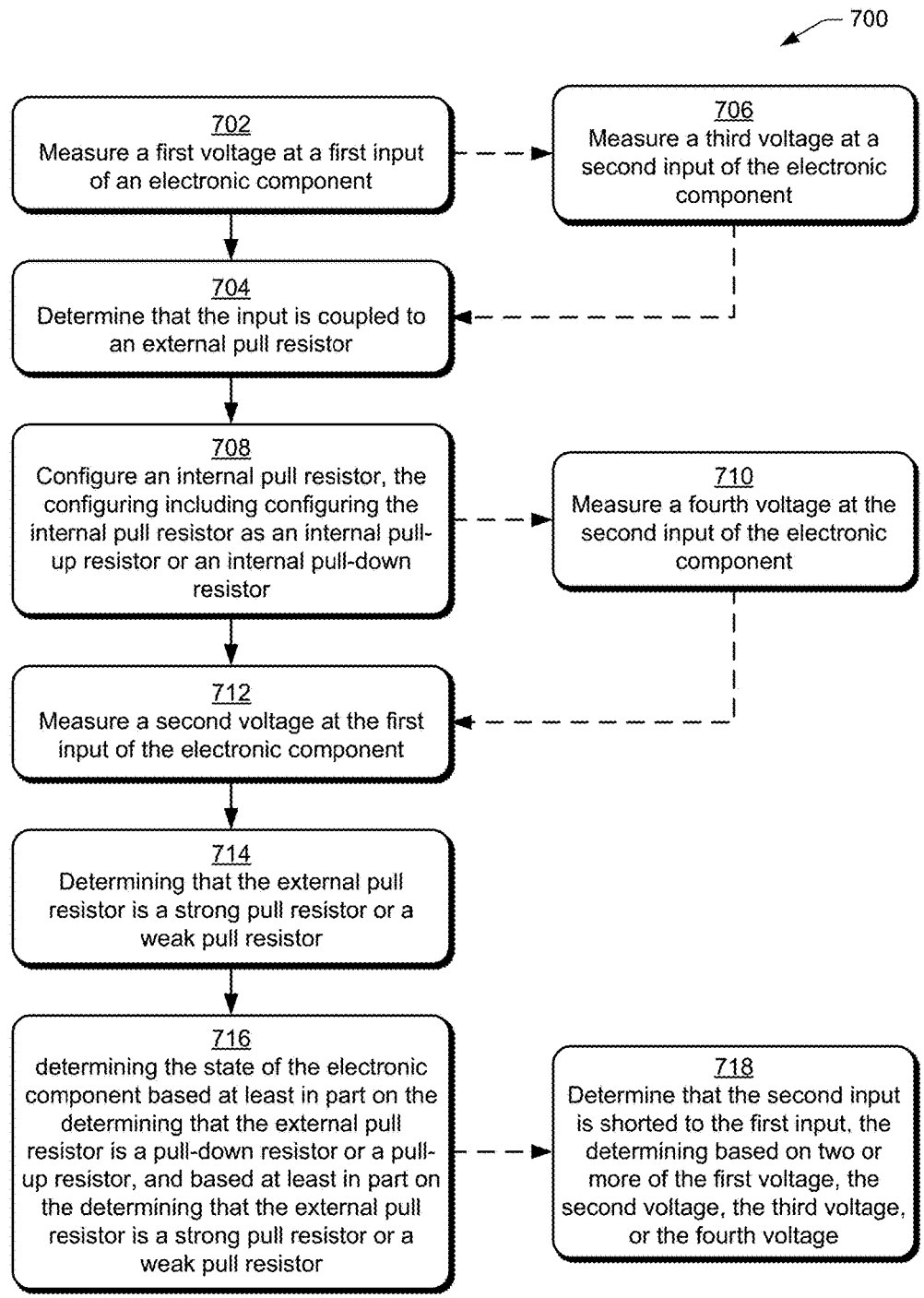
FIG. 7 is a flow diagram that describes operations in a method according to one or more implementations.

FIG. 7 is a flow diagram describing operations for determining a state of an input pin. At operation 702, a first voltage is measured at a first input of an electronic component. For example, the state determination module 612 causes one of the voltage sensors 608 to measure the first voltage at a first of the input/output pins 606. The first voltage may be measured with an internal pull resistor 106 or 108 uncoupled from the first input.

At operation 704, the input is determined to be coupled to an external pull resistor, based on the first voltage. The state determination module 612, for instance, may determine that the input is coupled to an external pull-up resistor based on a voltage reading at the input. For example, if the measured first voltage is high, the state determination module 612 determines that the first input is coupled to a pull-up resistor. This is shown in FIG. 3 with respect to the input pin 114 and the pull-up resistor 124. Alternatively, if the measured first voltage is low, the state determination module 612 determines that the first input is coupled to a pull-down resistor. This is shown in FIG. 3 with respect to the input pin 116 and the pull-up resistor 142.

At optional operation 706, a third voltage is measured at a second input of the electronic component. Optional operation 706 may be performed by the state determination module 612 causing another of the voltage sensors 608 to measure the third voltage at a second of the input/output pins 606.

At operation 708, an internal pull resistor is configured as the other of a pull-up resistor or a pull-down resistor, such that the internal pull resistor opposes the external pull resistor. Thus, if the first input is determined to be coupled to a pull-up resistor at operation 706, the internal pull resistor is configured as a pull-down resistor at operation 708. Alternatively, if the first input is determined to be coupled to a pull-down resistor at operation 706, the internal pull resistor is configured as a pull-up resistor at operation 708. As a result, the first input will be coupled to a pull-up resistor and a pull-down resistor, one of which being internal and one of which being external to the electronic component 104. Operation 708 may be performed by the state determination module 612 causing one of the pull resistors 610 to be configured as a pull-up resistor or a pull-down resistor, such that the one of the pull resistors 610 is configured to oppose the external pull resistor. At optional operation 710, a fourth voltage is measured at the second input of the electronic component. For example, the state determination module 612 causes the other of the voltage sensors 608 to measure the third voltage at a second of the input/output pins 606.

At operation 712, a second voltage is measured at the first input of the electronic component. Optional operation 712 may be performed by the state determination module 612 causing one of the voltage sensors 608 to measure the second voltage at the first of the input/output pins 606.

At operation 714, a state of the first input is determined based on identifying the external pull resistor as one of a strong pull-down resistor, a weak pull-down resistor, a weak pull-up resistor, or a strong pull-up resistor. This determination is made based on the first voltage and the second voltage. The first voltage indicates whether the external pull resistor is a pull-up resistor or a pull-down resistor, and the second voltage indicates whether the external pull resistor is a strong pull resistor or a weak pull resistor. For example, if the first voltage indicates that the external pull resistor is a pull-up resistor and the second voltage is high voltage, the external pull resistor is a strong pull-up resistor because it is strong enough to overcome the internal pull-down resistor. If the first voltage indicates that the external pull resistor is a pull-up resistor and the second voltage is a low voltage, then the external pull resistor is a weak pull-up resistor because it is not strong enough to overcome the internal pull-down resistor.

A similar evaluation is performed if the first voltage indicates that the external pull resistor is a pull-down resistor. For example, if the second voltage is high, the external pull resistor is a weak pull-down resistor because it is not strong enough to overcome the internal pull-up resistor. Alternatively, if the second voltage is low, the external pull resistor is a strong pull-down resistor because it is strong enough to overcome the internal pull-up resistor. Thus, the first input pin is one of four candidate input states. Operation 714 may be performed by the state determination module 612 based on the first voltage and the second voltage.

At optional operation 716, the second input is determined to be shorted to the first input, the determining based on two or more of the first voltage, the second voltage, the third voltage, or the fourth voltage. For example, the third and fourth voltages may be compared to detect a change in voltage based on a configuration of the internal pull resistor at operation 708. If the voltage changes based on the configuration of the internal pull resistor, which is coupled to the first input, then the second input is shorted to the first input. Alternatively, if the first and third voltages have a same measured voltage and the second and fourth voltages have a same measured voltage, then the first input and the second input may be determined to be shorted. In some implementations, a matching of the first voltage and the third voltage and a matching of the second voltage and a fourth voltage may cause the electronic component to perform an additional test to determine if the second input is shorted to the first input. For example, if the second input is a GPIO, a voltage is provided to the second input and a voltage is read at the first input to determine a short.

Figure 8:
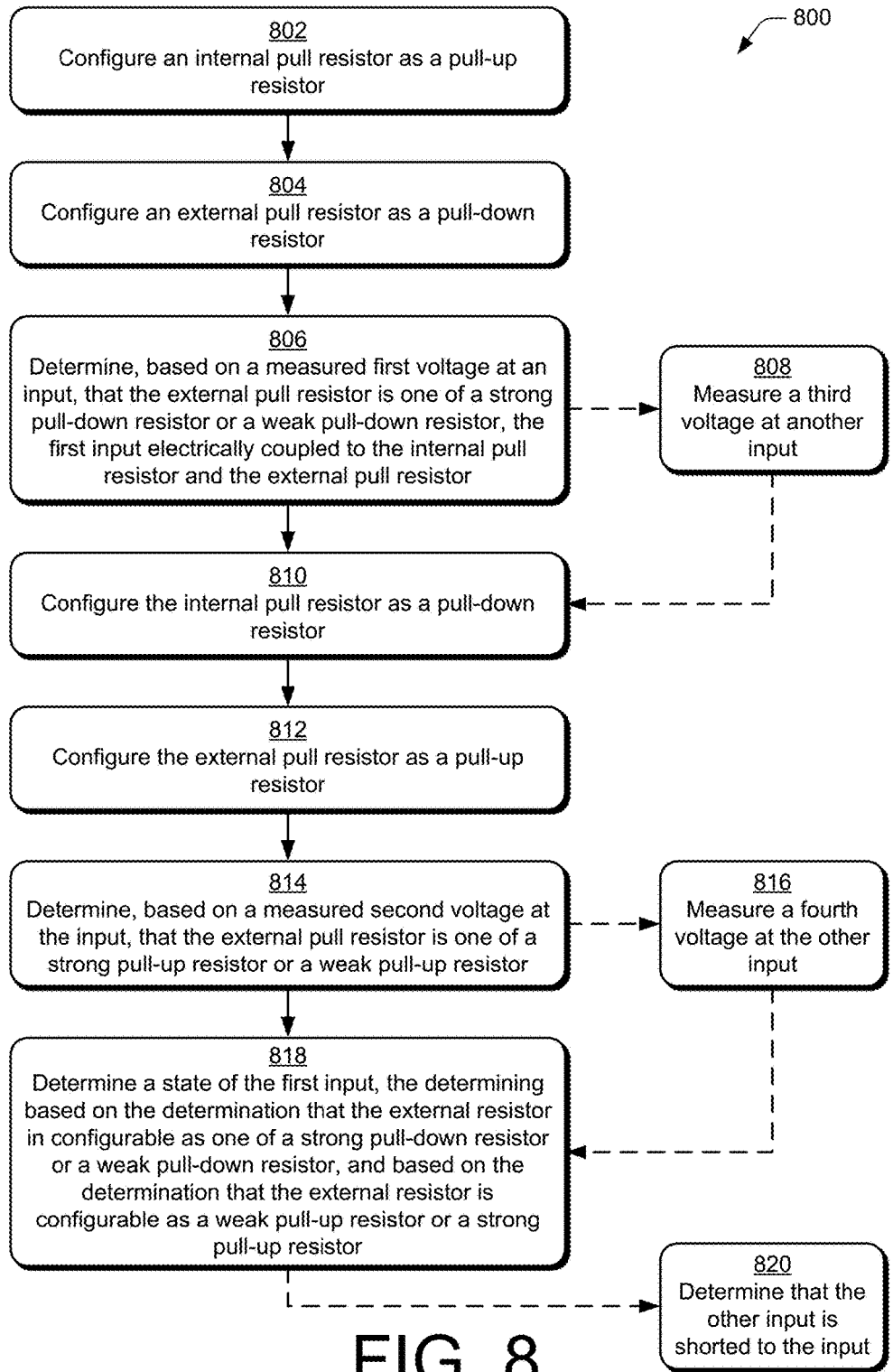
FIG. 8 is a flow diagram that describes operations in another method according to one or more implementations.

FIG. 8 is a flow diagram that describes operations in another method according to one or more implementations for determining a state of an input pin. At operation 802, an internal pull resistor is configured as a pull-up resistor. For example, one of the internal pull resistors 610 is configured, by the state determination module 612, as a pull-up resistor. At operation 804, an external pull resistor is configured as a pull-down resistor. Operation 804 may be performed by the electronic component 104 delivering a control signal to the external pull resistor for configuration as a pull-down resistor. For example, in FIG. 2, the electronic component 104 delivers a control signal from the input pin 114 to open the switch 122 and to close the switch 128.

At operation 806, the external pull resistor is determined, based on a measured first voltage, to be a strong pull-down resistor or a weak pull-down resistor. The first voltage is measured at an input that is coupled to the internal pull resistor and the external pull resistor. Operation 806 may be performed by the state determination module 612 determining whether the first voltage is high or low. If the first voltage is high, the external pull resistor is a weak pull-down resistor because it is unable to overcome the internal pull-up resistor. Alternatively, if the first voltage is low, the external pull resistor is a strong pull-down resistor because it is able to overcome the internal pull-up resistor. At optional operation 808, a third voltage is measured at another input. For example, the state determination module 612 causes another of the voltage sensors 608 to measure the third voltage at a second of the input/output pins 606.

At operation 810, the internal pull resistor is configured as a pull-down resistor. For example, the one of the internal pull resistors 610 is configured, by the state determination module 612, as a pull-down resistor. At operation 812, the external pull resistor is configured as a pull-up resistor. Operation 812 may be performed by the electronic component 104 delivering a control signal to the external pull resistor for configuration as a pull-up resistor. For example, in FIG. 2, the electronic component 104 delivers a control signal from the input pin 114 to close the switch 122 and to open the switch 128. At operation 814, the external pull resistor is determined, based on a measured second voltage at the input, to be a strong pull-up resistor or a weak pull-up resistor. For example, the state determination module 612 determines whether the second voltage is high or low. If the second voltage is high, the external pull resistor is a strong pull-up resistor. Alternatively, if the second voltage is low, the external pull resistor is a weak pull-up resistor. At operation 816, a fourth voltage is measured at the other input. For example, the state determination module 612 causes the other of the voltage sensors 608 to measure the fourth voltage at the second of the input/output pins 606.

At operation 818, a state of the first input is determined based on the determination that the external pull resistor is configurable as one of a strong pull-down resistor or a weak pull-down resistor, and based on the determination that the external resistor is configurable as a weak pull-up resistor or a strong pull-up resistor. The state of the first input pin may be based on pairings of configurable states of the external pull resistor. For example, four candidate pin states include (strong pull-up, strong pull-down), (strong pull-up weak pull-down), (weak pull-up, strong pull-down), and (weak pull-up, weak pull-down).

At operation 820, the other input is determined to be shorted to the input. This determination may be based on comparing two or more of the first voltage, the second voltage, the third voltage, or the fourth voltage, as similarly discussed with reference to optional operation 716.

Figure 9:
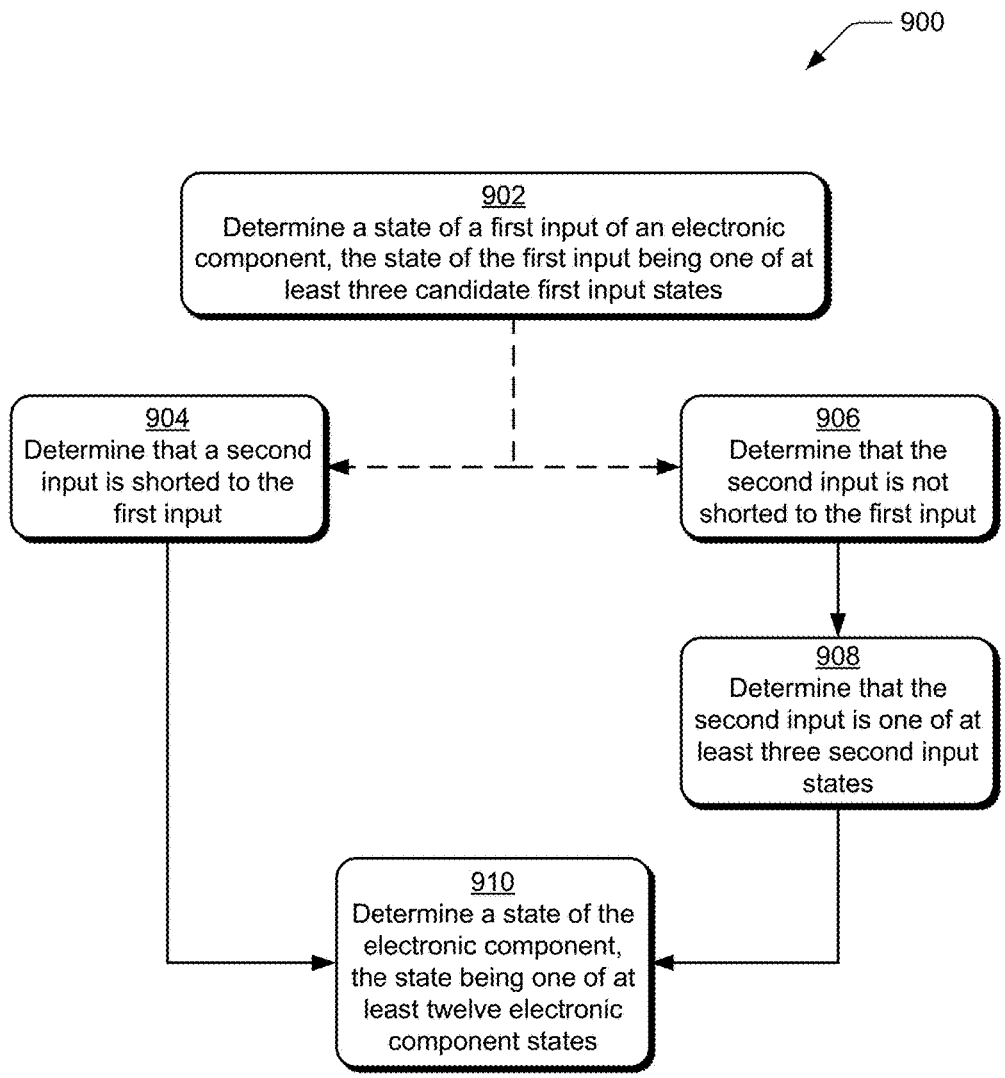
FIG. 9 is a flow diagram that describes operations in another method according to one or more implementations.

FIG. 9 is a flow diagram that describes operations in another method according to one or more implementations for determining a state of an electronic component. At operation 902, a first input state of a first input of an electronic component is determined. The state of the first input is one of at least three candidate first input states. FIGS. 2-5 show internal pull resistors 106 and 108 being configurable as a pull-up resistor and as a pull-down resistor, thus allowing the state determination module 612 to determine a state of the input pins 114 and 116 from four candidate pin states as discussed herein. However, alternative configurations may be used to determine a state of the input pins 114 and 116 from three candidate pin states. For example, if the internal pull resistors 106 and 108 are configurable as only one of a pull-up resistor or a pull-down resistor, the input pins 114 and 116 would have only three candidate pin states.

In one of these implementations, an internal pull resistor 610 is only configurable as a pull-down resistor. A first voltage is measured with the internal pull resistor 610 disconnected from an input/output pin 606 to determine if the input/output pin 606 is coupled to an external pull-up or a pull-down resistor. If the input/output pin 606 is coupled to an external pull-up resistor, the internal pull resistor 610 is coupled to the input/output pin 606 to determine a strength of the external pull resistor according to techniques disclosed herein. Alternatively, if the input/output pin 606 is coupled to an external pull-down resistor, it would not provide further information to couple the internal pull resistor 610 to the input/output pin 606, because the voltage sensor 608 would read a low voltage whether the external pull resistor is a weak pull-down resistor or a strong pull-down resistor. Therefore, the input pins 114 and 116 have only three candidate pin states: pull-down, weak pull-up, or strong pull-up.

At optional operation 904, a second input is determined to be shorted to the first input. As discussed herein, the state determination module 612 may use the voltage sensor(s) 608 to measure voltages during various configurations of internal or external pull resistors to determine that a second input is shorted to the first input. Alternatively, at optional operation 906, the second input is determined to not be shorted to the first input. Similar to the determination of optional operation 904, the state determination module 612 may use the voltage sensor(s) 608 to measure voltages during various configurations of internal or external pull resistors to determine that a second input is not shorted to the first input.

At operation 908, the second input is determined to be one of three candidate second input states. Operation 908 may be performed using techniques disclosed herein, such as the techniques described with reference to operation 902. At operation 910, a state of the electronic component is determined based on at least twelve candidate electronic-component states. The at least twelve candidate electronic-component states are based on possible combinations of the candidate input states of the first input and the second input. The at least twelve candidate electronic-component states are shown in FIG. 10.

FIG. 10 includes a spreadsheet 1002 showing twelve candidate electronic-component states based on two three-state inputs. The three-state inputs may be created using a single-configuration internal pull resistor, as discussed herein, or any known input configuration to generate three candidate pin states. As shown in the spreadsheet 1002, nine candidate electronic-component states are derived from combinations of states of the individual inputs and three additional candidate electronic-component states are derived based on determining that the second input is shorted to the first input.

A spreadsheet 1004 shows twenty candidate electronic-component states based on two four-state inputs. As shown in the spreadsheet, sixteen candidate electronic-component states are indicated based combined states of the individual inputs and four additional candidate electronic-component states are indicated based on determining that the second input is shorted to the first input.

Although not included in FIG. 10, candidate electronic-component states increase dramatically with an addition of a third input pin and/or a fourth input pin. For example, fifty-seven candidate electronic-component states may be derived from three three-state input pins (twenty-seven derived from combinations of the states of the individual inputs and thirty additional states derived based on determining shorting between the first input and the second input, the first input and the third input, and shorting among all three inputs). Alternatively, one-hundred-sixteen candidate electronic-component states may be derived from three four-state input pins (sixty-four derived from combinations of the states of the individual inputs and fifty-two additional states derived based on determining shorting between the first input and the second input, the first input and the third input, and shorting among all three inputs).

Thus, the techniques described herein permit additional information to be conveyed to the electronic component 104 by increasing a quantity of available states for input pins 114 and 116. As a result, the electronic component 104 has additional candidate electronic-component states, and thus, more candidate electronic-component configurations, using a same quantity of input pins. Alternatively, fewer input pins are required to allow a same quantity of candidate electronic-component configurations for the electronic component 104.

Example System

Figure 11:
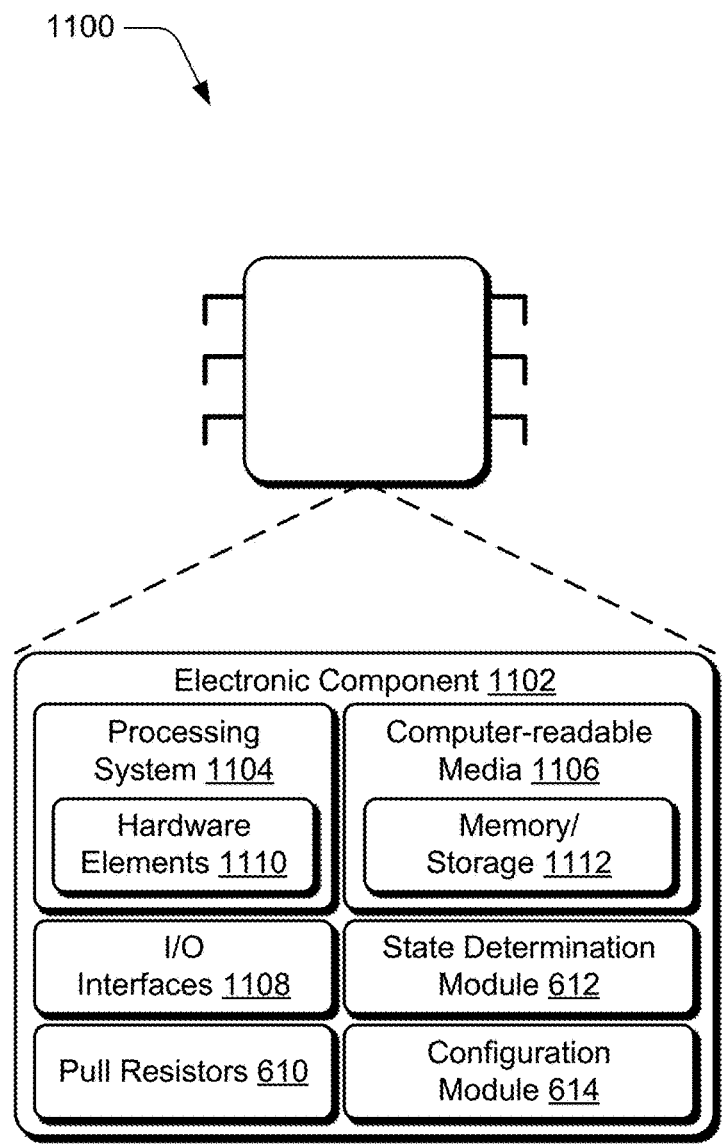
FIG. 11 illustrates an example system including various components of an electronic component that can be implemented as any type of electronic component as described and/or utilized with reference to FIGS. 1-10 to implement aspects of the techniques described herein.

FIG. 11 illustrates an example system 1100 including an electronic component that can be implemented as any type of electronic component as described and/or utilized with reference to FIGS. 1-10 to implement aspects of the techniques described herein. This is illustrated through inclusion of the pull resistors 610, the state determination module 612, and the configuration module 614. The electronic component 1102 may be, for example, a processing component, a graphics processing chip, a memory component, a communication chip, a power control component, an input component, or an output component. The electronic component 1102 include a system on chip configuration.

The electronic component 1102, as illustrated, includes a processing system 1104, one or more computer-readable media 1106, and one or more I/O interfaces 1108 that are communicatively coupled, one to another. Although not shown, the electronic component 1102 may further include a data and command transfer system that couples the various components one to another. A system bus can include any one or combination of control and data lines, transistors, switches, and other elements.

The processing system 1104 is representative of functionality to perform one or more operations using hardware. Accordingly, the processing system 1104 is illustrated as including hardware elements 1110, which may be configured as processors, functional blocks, and so forth. This may include implementation in hardware as an application-specific integrated circuit or other logic device formed using one or more semiconductors. The hardware elements 1110 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

Computer-readable storage media 1106 is illustrated as including memory/storage 1012. Memory/storage 1112 represents memory/storage capacity associated with one or more computer-readable media. Memory/storage 1112 may include volatile media (such as random access memory (RAM)) and/or nonvolatile media (such as read only memory (ROM), Flash memory, and so forth). Memory/storage 1112 may include fixed media (e.g., RAM, ROM, a fixed hard drive, and so on). Computer-readable media 1106 may be configured in a variety of other ways as further described below.

I/O interfaces 1108 are representative of functionality to receive and send information by the electronic component 1102 via input and output connections. For example, the input/output interfaces may include electrical connections via input pins, output pins, GPIO pins, voltage in pins, or voltage out pins. Thus, the electronic component 1102 may be configured in a variety of ways as further described below to support interaction with a circuit board assembly.

Various techniques may be described herein in the general context of software, hardware elements, or program modules. Generally, such modules include routines, programs, objects, elements, components, data structures, and so forth that perform particular tasks or implement particular abstract data types. The entities described herein (e.g., the state determination module 612) generally represent software, firmware, hardware, or a combination thereof. The features of the techniques described herein are platform-independent, meaning that the techniques may be implemented on a variety of commercial computing platforms having a variety of processors.

An implementation of the described entities and techniques may be stored on or transmitted across some form of computer-readable media. The computer-readable media may include a variety of media that may be accessed by the electronic component 1102. By way of example, and not limitation, computer-readable media may include "computer-readable storage media" and "computer-readable signal media."

"Computer-readable storage media" refers to media and/or devices that enable persistent and/or non-transitory storage of information in contrast to mere signal transmission, carrier waves, or signals per se. Thus, computer-readable storage media refers to non-signal bearing media. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology.

"Computer-readable signal media" may refer to a signal-bearing medium that is configured to transmit instructions to the hardware of the electronic component 1102, such as via a network. Signal media typically may embody computer readable instructions, data structures, program modules, or other data in a modulated data signal, such as carrier waves, data signals, or other transport mechanism. Signal media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 1110 and computer-readable media 1106 are representative of modules, programmable device logic and/or fixed device logic implemented in a hardware form that may be employed to implement at least some aspects of the techniques described herein. Hardware may include components of an integrated circuit or on-chip system, an application-specific integrated circuit (ASIC), a field-programmable gate array (FPGA), a complex programmable logic device (CPLD), and other implementations in silicon or other hardware. In this context, hardware may operate as a processing device that performs program tasks defined by instructions and/or logic embodied by the hardware as well as a hardware utilized to store instructions for execution, e.g., the computer-readable storage media described previously.

Combinations of the foregoing may also be employed to implement various techniques described herein. Accordingly, software, hardware, or executable modules may be implemented as one or more instructions and/or logic embodied on some form of computer-readable storage media and/or by one or more hardware elements 1110. The electronic component 1102 may be configured to implement particular instructions and/or functions corresponding to the software and/or hardware modules. Accordingly, implementation of a module that is executable by the electronic component 1102 as software may be achieved at least partially in hardware, e.g., through use of computer-readable storage media and/or hardware elements 1110 of the processing system 1104. The instructions and/or functions may be executable/operable by one or more articles of manufacture (for example, one or more electronic components 1102 and/or processing systems 1104) to implement techniques, modules, and examples described herein. The techniques described herein may be supported by various configurations of the electronic component 1102 and are not limited to the specific examples of the techniques described herein.

CONCLUSION

Although the implementations have been described in language specific to structural features and/or methodological acts, it is to be understood that the implementations defined in the appended claims are not necessarily limited to the specific features or acts described. Rather, the specific features and acts are disclosed as example forms of implementing the claimed implementations.

What is claimed is:

1. A method for determining a state of an electronic component, the method comprising:
    measuring a first voltage at an input of an electronic component;
    determining, based on the first voltage, that the input is coupled to an external pull resistor;
    configuring an internal pull resistor, the configuring comprising:
        configuring the internal pull resistor as an internal pull-up resistor in response to a determination, based on the first voltage, that the external pull resistor is a pull-down resistor; or
        configuring the internal pull resistor as an internal pull-down resistor in response to a determination, based on the first voltage, that the external pull resistor is a pull-up resistor;
    measuring, after configuring the internal pull resistor, a second voltage at the input of the electronic component;
    determining, based on the second voltage, that the external pull resistor is a strong pull resistor or a weak pull resistor;
    determining a state of the input based at least in part on determining that the external pull resistor is a pull-down resistor or a pull-up resistor, and based at least in part on determining that the external pull resistor is a strong pull resistor or a weak pull resistor; and
    determining the state of the electronic component based at least in part on the state of the input.

2. A method as in claim 1, the method further comprising determining the state of the electronic component based in part on a state of one or more other inputs of the electronic device.

3. A method as in claim 1, the method further comprising configuring the electronic component to operate in a configuration corresponding to the state of the electronic component.

4. A method as in claim 1, wherein the electronic component is one of a memory unit or a processing unit.

5. A method as in claim 1, wherein:
    the external pull resistor is determined to be a pull-up resistor based on the first voltage measuring at or above a pull-up threshold;
    the internal pull resistor is configured as a pull-down resistor in response to the determining that the external pull resistor is a pull-up resistor; and
    the state of the input is determined to correspond to a strong pull-up resistor based on the second voltage being at or above a pull-up threshold.

6. A method as in claim 1, wherein:
    the external pull resistor is determined to be a pull-up resistor based on the first voltage measuring at or above a pull-up threshold;
    the internal pull resistor is configured as a pull-down resistor in response to the determining that the external pull resistor is a pull-up resistor; and
    the state of the input is determined to correspond to a weak pull-up resistor based on the second voltage being at or below a pull-up threshold.

7. A method as in claim 1, wherein:
    the external pull resistor is determined to be a pull-down resistor based on the first voltage measuring at or below a pull-down threshold;
    the internal pull resistor is configured as a pull-up resistor in response to the determining that the external pull resistor is a pull-down resistor; and
    the state of the input is determined to correspond to a strong pull-down resistor based on the second voltage being at or below a pull-down threshold.

8. A method as in claim 1, wherein:
    the external pull resistor is determined to be a pull-down resistor based on the first voltage measuring at or below a pull-down threshold;
    the internal pull resistor is configured as a pull-up resistor in response to the determining that the external pull resistor is a pull-down resistor; and
    the state of the input is determined to correspond to a weak pull-down resistor based on the second voltage being at or above a pull-down threshold.

9. A circuit board assembly comprising:
    an external pull resistor having a first terminal coupled to one of a first reference voltage or a second reference voltage, the first reference voltage being a higher voltage than the second reference voltage; and an electronic component including:
an input coupled to a second terminal of the external pull resistor;
an internal pull resistor coupleable to the input, the internal pull resistor configurable as a pull-up resistor and a pull-down resistor;
a processor; and
one or more computer-readable media storing processor-executable instructions that, responsive to execution by the processor, enable determining a state for the electronic component, the processor-executable instructions being executable to perform operations including:
measuring a first voltage at the input, the first voltage measured with the internal pull resistor uncoupled from the input;
determining, based on the first voltage, that the external pull resistor is one of a pull-up resistor or a pull-down resistor;
measuring a second voltage at the input, the second voltage measured with the internal pull resistor coupled to the input and configured as a pull-up resistor or a pull-down resistor to oppose the external pull resistor; and
determining a state of the input based on the second voltage.

10. A circuit board assembly as in claim 9, wherein the internal pull resistor includes:
a first internal resistor coupleable to the input and a third reference voltage, the first internal resistor coupleable to one of the input or the third reference voltage via a first internal switch; and
a second internal resistor coupleable to the input and a fourth reference voltage, the second internal resistor coupleable to one of the input or the fourth reference voltage via a second internal switch;
wherein the third reference voltage is higher than the fourth reference voltage;
wherein the internal pull resistor is configured as a pull-up resistor by closing the first internal switch and opening the second internal switch; and
wherein the internal pull resistor is configured as a pull-down resistor by opening the first internal switch and closing the second internal switch.

11. A circuit board assembly as in claim 10, wherein the first reference voltage and the third reference voltage have a same high voltage, and wherein the second reference voltage and the fourth reference voltage have a same low voltage.

12. A circuit board assembly as in claim 9, wherein the internal pull resistor includes:
a resistor having a first terminal coupled to the input and a second terminal coupled to a first internal switch and a second internal switch;
wherein the first internal switch, when closed, couples the internal pull resistor to a third reference voltage to configure the internal pull resistor as a pull-up resistor;
wherein the second internal switch, when closed, couples the internal resistor to a fourth reference voltage to configure the internal pull resistor as a pull-down resistor, the fourth reference voltage being a lower voltage than the third voltage.

13. A circuit board assembly as in claim 12, wherein the first reference voltage and the third reference voltage are a same high voltage, and wherein the second reference voltage and the fourth reference voltage are a same low voltage.

14. A circuit board assembly as in claim 12, wherein the operations further include:
determining a candidate electronic-component state based at least in part on the determined state of the input; and
configuring the electronic component based on the determined candidate electronic-component state.

15. An electronic component including:
a first input configured to couple the electronic component to a circuit board;
a second input configured to couple the electronic component to the circuit board;
a first internal pull resistor that is coupleable to the first input, the first internal pull resistor configurable as a pull-up resistor or a pull-down resistor;
a second internal pull resistor that is coupleable to the second input, the second internal pull resistor configurable as a pull-up resistor or a pull-down resistor; and
a state determination module configured to:
determine a state of the first input including:
measuring a first voltage at the first input, the first voltage measured with the first internal pull resistor uncoupled from the first input;
determining, based on the first voltage, that a first external resistor is one of a pull-up resistor or a pull-down resistor, the first external resistor coupled to the first input;
measuring a second voltage at the first input, the second voltage measured with the first internal pull resistor coupled to the first input and configured to oppose the first external resistor; and
determining, based on the first voltage and the second voltage, that the state of the first input is one of at least three first input states;
determine a state of the second input including:
measuring a third voltage at the second input, the third voltage measured with the second internal pull resistor uncoupled from the second input;
determining, based on the third voltage, that a second external resistor is one of a pull-up resistor or a pull-down resistor, the second external resistor coupled to the second input;
measuring a fourth voltage at the second input, the fourth voltage measured with the second internal pull resistor coupled to the second input; and
determining, based on the third voltage and the fourth voltage, that the state of the second input is one of at least three second input states; and
determining a candidate electronic-component state based at least in part on the state of the first input and the state of the second input.

16. An electronic component as in claim 15, wherein the first input is determined to be shorted with the second input based on voltage measurements of the first input and the second input.

17. An electronic component as in claim 15, further comprising a configuration module to configure the electronic component based on the indicated candidate electronic-component state.

18. An electronic component as in claim 15, wherein the state of the electronic component is one of at least twelve states, the at least twelve states including:
states based on combinations of each of the at least three first input states with each of the at least three second input states; and
states based on a determination that the first input is shorted with the second input at each of the at least three first input states.

19. An electronic component as in claim 15:
wherein the first internal pull resistor is configured as a pull-up resistor when coupled to a first reference voltage;
wherein the first internal pull resistor is configured as a pull-down resistor when coupled to a second reference voltage, the second reference voltage being a lower voltage than the first reference voltage; and
wherein the first external resistor is coupled to a third reference voltage, the third reference voltage having a same voltage as one of the first reference voltage or the second reference voltage.

20. An electronic component as in claim 15, wherein the state determination module is further configured to configure the electronic component based on the state of the electronic component.

* * * * *